US008580078B2

(12) United States Patent
Bailey, III et al.

(10) Patent No.: US 8,580,078 B2
(45) Date of Patent: Nov. 12, 2013

(54) BEVEL ETCHER WITH VACUUM CHUCK

(75) Inventors: Andrew D. Bailey, III, Pleasanton, CA (US); Alan M. Schoepp, Ben Lomond, CA (US); Gregory Sexton, Fremont, CA (US); William S. Kennedy, Fremont, CA (US)

(73) Assignee: Lam Research Corporation, Fremont, CA (US)

( * ) Notice: Subject to any disclaimer, the term of this patent is extended or adjusted under 35 U.S.C. 154(b) by 781 days.

(21) Appl. No.: 11/698,189

(22) Filed: Jan. 26, 2007

(65) Prior Publication Data

US 2008/0179010 A1    Jul. 31, 2008

(51) Int. Cl.
  *C23C 16/00*  (2006.01)
  *C23F 1/00*  (2006.01)
  *H01L 21/306*  (2006.01)

(52) U.S. Cl.
  USPC ..................... 156/345.43; 118/728

(58) Field of Classification Search
  USPC ..................... 156/345.43; 118/728
  See application file for complete search history.

(56) References Cited

U.S. PATENT DOCUMENTS

| | | | |
|---|---|---|---|
| 4,875,989 A | 10/1989 | Davis et al. | |
| 4,899,195 A | 2/1990 | Gotoh | |
| 5,213,650 A | 5/1993 | Wang et al. | |
| 5,324,012 A | 6/1994 | Aoyama et al. | |
| 5,425,846 A | 6/1995 | Koze et al. | |
| 5,622,593 A | 4/1997 | Arasawa et al. | |
| 5,945,351 A | 8/1999 | Mathuni | |
| 6,004,631 A | 12/1999 | Mori | |
| 6,406,589 B1 | 6/2002 | Yanagisawa | |
| 6,436,303 B1 | 8/2002 | Kim et al. | |
| 6,837,963 B2 | 1/2005 | Tanaka et al. | |
| 6,837,967 B1 * | 1/2005 | Berman et al. | 156/345.3 |
| 8,262,846 B2 | 9/2012 | Nogami et al. | |
| 2003/0156270 A1 * | 8/2003 | Hunter | 355/72 |
| 2003/0178134 A1 * | 9/2003 | Muramoto et al. | 156/285 |

(Continued)

FOREIGN PATENT DOCUMENTS

| | | |
|---|---|---|
| JP | 02-192717 | 7/1990 |
| JP | 4152512 A | 5/1992 |

(Continued)

OTHER PUBLICATIONS

International Search Report and Written Opinion dated Jun. 24, 2008 for PCT/US2008/000929.

(Continued)

*Primary Examiner* — Keath Chen
(74) *Attorney, Agent, or Firm* — Buchanan Ingersoll & Rooney PC

(57) ABSTRACT

A bevel etcher incorporating a vacuum chuck used for cleaning the bevel edge and for reducing the bending curvature of a semiconductor substrate. The bevel etcher includes a vacuum chuck and a plasma generation unit which energizes process gas into a plasma state. The vacuum chuck includes a chuck body and a support ring. The top surface of the chuck body and inner periphery of the support ring form a vacuum region enclosed by the bottom surface of a substrate mounted on the support ring. A vacuum pump evacuates the vacuum region during operation. The vacuum chuck is operative to hold the substrate in place by the pressure difference between the top and bottom surfaces of the substrate. The pressure difference also generates a bending force to reduce the bending curvature of the substrate.

11 Claims, 7 Drawing Sheets

(56) References Cited

U.S. PATENT DOCUMENTS

| | | |
|---|---|---|
| 2004/0137745 A1 | 7/2004 | Houghton et al. |
| 2004/0238488 A1 | 12/2004 | Choi et al. |
| 2005/0173067 A1* | 8/2005 | Lim .................. 156/345.32 |
| 2005/0178505 A1 | 8/2005 | Kim |
| 2005/0263484 A1* | 12/2005 | Park et al. .................. 216/59 |
| 2006/0130767 A1 | 6/2006 | Herchen |

FOREIGN PATENT DOCUMENTS

| | | |
|---|---|---|
| JP | 05-082478 | 4/1993 |
| JP | 07-142449 | 6/1995 |
| JP | 11214486 A | 8/1999 |
| JP | 2000332088 A | 11/2000 |
| KR | 1020060037819 A | 5/2006 |

OTHER PUBLICATIONS

Official Action issued Apr. 14, 2010 for Chinese Appln. No. 200880003201.X.

Official Action mailed Apr. 13, 2012 for Japanese Patent Application No. 2009-547291 (Partial Translation).

* cited by examiner

BEVEL ETCHER WITH VACUUM CHUCK

BACKGROUND

Integrated circuits are formed from a wafer or substrate over which are formed patterned microelectronics layers. In the processing of the substrate, plasma is often employed to etch intended portions of films deposited on the substrate. Typically, etch plasma density is lower near the edge of the substrate, which may result in accumulation of a poly-silicon layer, a nitride layer, a metal layer, etc. (collectively referred to as byproduct layer) on the top and bottom surfaces of the substrate bevel edge. As successive byproduct layers are deposited on the top and bottom surfaces of the substrate bevel edge as a result of several different etch processes, the bonds between the byproduct layers and the substrate will eventually weaken and the byproduct layers may peel or flake off, often onto other substrates during substrate transport thereby contaminating the other substrates.

SUMMARY

According to one embodiment, a vacuum chuck arrangement for use in a bevel etcher wherein a bevel edge of a semiconductor substrate is subjected to plasma cleaning, comprises a support ring having an upper surface configured to support a semiconductor substrate such that a bevel edge of the substrate extends outwardly of an outer edge of the upper surface and a chuck body having a recessed surface with optional lift pin holes therein. The recessed surface extends between an inner periphery of the support ring and is below the underside of the substrate supported on the upper surface of the support ring. The recessed surface and inner periphery define a vacuum region beneath the substrate supported on the support ring and at least one gas passage having an inlet is in fluid communication with the vacuum region. The gas passage has an outlet to which a vacuum force can be applied to place a vacuum force on the underside of the substrate.

A bevel etcher wherein the bevel edge of a semiconductor substrate can be plasma etched, comprising a chamber having a vacuum chuck body and a support ring surrounding the upper edge of the vacuum chuck body to form a space surrounded by a surface of the vacuum chuck body and inner periphery of the support ring, the support ring being adapted to support a substrate having a bevel edge such that the bottom surface of the substrate encloses the space and a plasma generation unit adapted to energize process gas into a plasma state in the vicinity of the bevel edge and a source of vacuum in fluid communication with the space, the vacuum source being adapted to establish a vacuum force which holds the substrate in place on the support ring.

A method of reducing curvature of a bowed semiconductor substrate, comprising loading a semiconductor substrate having a bowed curvature onto the support ring of the bevel etcher, evacuating the space by use of a vacuum source and energizing process gas into a plasma state and removing buildup on the bevel edge by etching the buildup with the plasma.

DETAILED DESCRIPTION

Figures 1A, 1B:
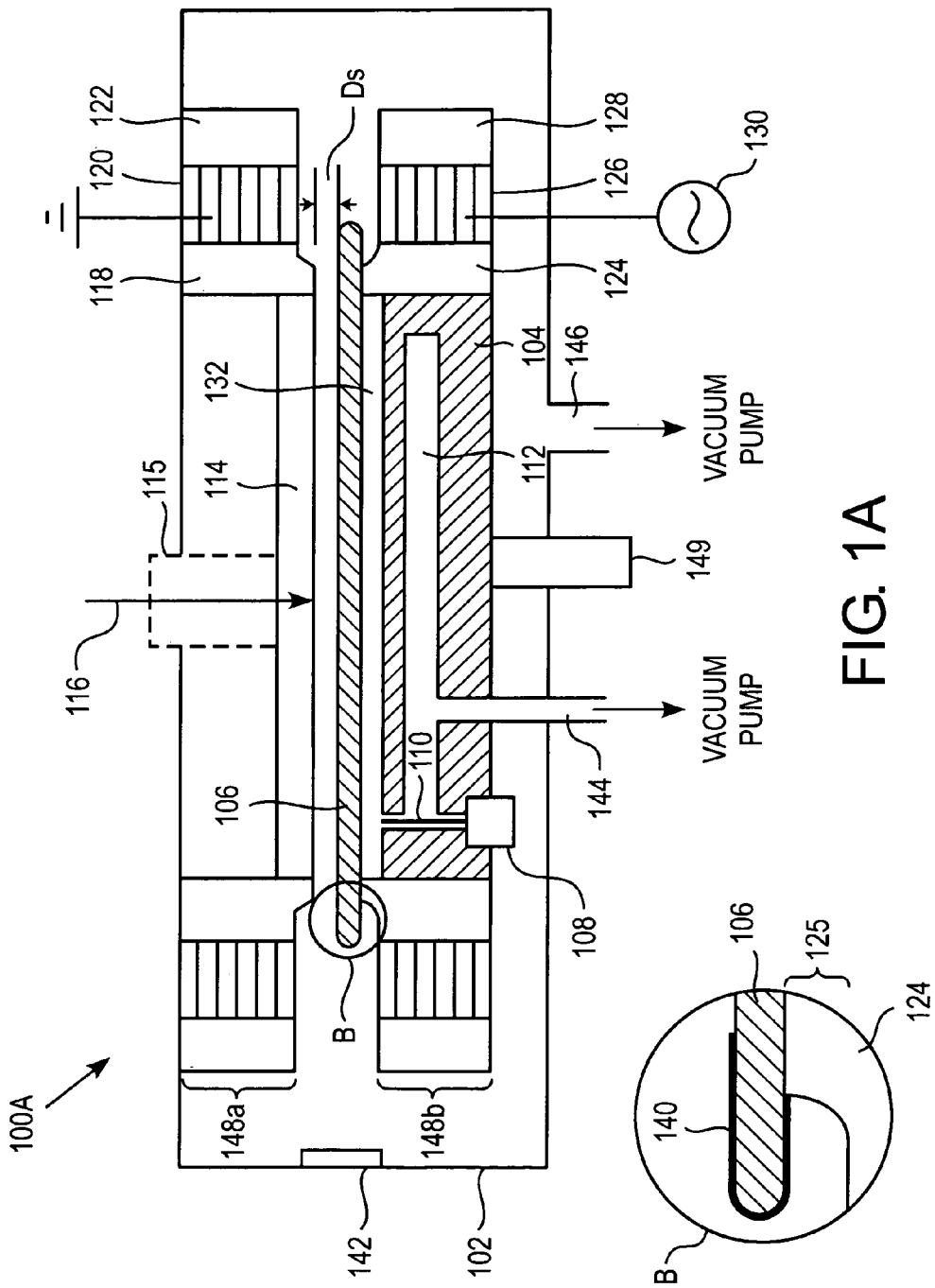
FIG. 1A shows a schematic cross sectional diagram of a substrate etching system having a vacuum chuck in accordance with one embodiment.
FIG. 1B is an enlarged schematic diagram of region B in FIG. 1A.

Referring now to FIG. 1A, there is shown a schematic cross sectional diagram of a substrate etching system or bevel etcher 100A in accordance with one embodiment. The substrate 106 has a bevel edge 140 that includes top and bottom surfaces of the edge of the substrate, as shown in region B of FIG. 1A and enlarged region B in FIG. 1B.

As depicted in FIGS. 1A-1B, the bevel etcher includes: a wall 102 having an opening or gate 142 through which a substrate 106 is loaded/unloaded; a vacuum chuck or substrate support 104 for holding the substrate 106 in position during operation; a gas distribution plate 114 coupled to a gas feed 116 and opposing the vacuum chuck 104; a bottom edge electrode or bottom electrode ring 126 made of conductive materials, such as aluminum; a bottom support ring 124 positioned between the vacuum chuck 104 and the bottom edge electrode 126 (e.g., a dielectric support ring electrically separating the vacuum chuck and bottom edge electrode); a top edge electrode or top electrode ring 120; and a top ring 118 positioned between the gas distribution plate 114 and the top edge electrode 120 (e.g., a dielectric ring electrically isolating the gas distribution plate and top edge electrode). Beyond the top and bottom edge electrodes 120, 126 are top and bottom insulating rings 122, 128, which are made of dielectric materials and respectively extend the surfaces of the top and bottom edge electrodes 120, 126 facing the substrate 106. The bottom support ring 124 has, but is not limited to, a circular or a rectangular configuration when viewed from the top. Likewise, the upper edge of the vacuum chuck 104, the bottom edge electrode 126, and bottom insulating ring 128 have, but are not limited to, circular or rectangular configurations when viewed from the top. Similarly, the top insulating ring 122, top edge electrode 120, top ring 118, and the outer edge of the gas distribution plate 114 have, but are not limited to, circular or rectangular configurations when viewed from the top.

The rings 118, 124 can be of dielectric, semiconductive or electrically conductive material such as rings entirely of aluminum oxide ($Al_2O_3$), aluminum nitride (AlN), silicon oxide ($SiO_2$), silicon carbide (SiC), silicon nitride ($Si_3N_4$), silicon (Si), yttria ($Y_2O_3$) or other materials or the support ring 124 can be a composite ring of metal, ceramic or polymer coated with a conductive or dielectric material such as Si, SiC or $Y_2O_3$.

The substrate 106 is mounted on top of the bottom support ring 124. More specifically, the top portion of the support ring 124 includes a ring-shaped protrusion 125 (FIG. 1B) and the substrate 106 is seated on the ring-shaped protrusion. The ring-shaped protrusion 125 has a narrow cross section so as to expose the edge portion of the bottom surface of the substrate 106 to cleaning plasma. The bevel etcher 100A also includes lift pins 110 for raising the substrate 106 from the top protrusion portion during loading/unloading of the substrate. The lift pins 110 move vertically through cylindrical holes or paths and are operated by pin operating unit 108 positioned under the vacuum chuck 104. Alternatively, the pin operating unit 108 may be located outside of the wall 102. It should be apparent to those of ordinary skill that any suitable number of pins 110 may be used in the bevel etcher 100A. Also, any suitable mechanisms, such as lifter bellows, pneumatic or mechanically driven arrangement can be used as the pin operating unit 108.

To load the substrate 106, the bottom electrode assembly 148b, which includes the vacuum chuck 104, lift pins 110, pin operating unit 108, bottom support ring 124, bottom edge electrode 126, and bottom insulating ring 128, is lowered by a vertical displacement unit 149. Subsequently, the lift pins 110 are moved upward by the pin operating unit 108 to receive the substrate 106. Next, the lift pins 110 are retracted to mount the substrate 106 on the bottom support ring 124. As a variation, the bottom electrode assembly 148b is immovably mounted on the bottom wall of the chamber. In this variation, the top electrode assembly 148a, which includes the top insulating ring 122, top edge electrode 120, top ring 118, and gas distribution plate 114, may be moved by an optional vertical displacement unit 115 to provide space to load the substrate. Also the top electrode assembly 148a may be suspended from the vertical displacement unit 115. If desired, upper and lower vertical displacement units 115, 149 can vertically move the top and bottom electrode assemblies. The vertical displacement units 115, 149 operate as gap control mechanisms for controlling the gap between the top and bottom electrode assemblies 148a, 148b.

The top surface of the vacuum chuck 104, the bottom surface of the substrate 106, and the top protrusion portion 125 of the bottom support ring 124 form an enclosed vacuum region recess ("vacuum region") 132, wherein the gas pressure in the vacuum region 132 is maintained below atmospheric pressure during operation. The cylindrical holes or paths for the lift pins 110 are also shared as gas passageways, through which a vacuum pump coupled to an outlet 144 evacuates the vacuum region 132. The vacuum chuck 104 includes a plenum 112 to reduce temporal pressure fluctuations in the vacuum region 132 and, in cases where multiple lift pins are used, to provide a uniform suction rate for the cylindrical holes.

The top edge electrode 120 is made of a conductive material, such as aluminum, and is preferably grounded. The bottom edge electrode 126 is preferably coupled to a radio frequency (RF) power source 130 that supplies RF power at a frequency range from, but not limited to, ~2 MHz to ~13 MHz and a power between ~100 watts to ~2000 watts to generate cleaning plasma around the bevel edge 140. During bevel edge cleaning, the vacuum chuck 104 and the gas distribution plate 114 are kept electrically floating. The cleaning plasma is confined by the top ring 118, top edge electrode 120, top insulating ring 122, bottom support ring 124, bottom edge electrode 126, and bottom insulating ring 128. It is noted that the frequency and power applied to the top and bottom electrodes 120, 126 may be changed depending on the types of the process gas ("cleaning gas") and materials to be removed from the bevel edge 140.

The cleaning gas(es) is provided through the gas feed 116. The gas feed 116 is located near the center of the gas distribution plate 114. Alternatively, as detailed in conjunction with FIGS. 4A-6, the cleaning gas(es) can be provided through gas feed(s) disposed in other portions of the upper electrode assembly 148a.

To hold the substrate 106 in place during operation, a pressure difference between the top surface of the substrate 106 and the vacuum region 132 needs to be maintained above a threshold. The pressure on the top surface of the substrate 106 is a function of the gas pressure in the gas distribution plate 114, gas flow rate, and the spacing or gap "Ds" between the substrate 106 and the gas distribution plate 114. To increase the gas pressure on the top surface of the substrate 106 for a given pumping rate through the outlet 146, the gap Ds needs to be minimized. During the bevel edge cleaning process, the gap Ds is kept preferably below 0.6 mm, more preferably at ~0.4 mm, for instance. As discussed above, the gap Ds is controlled by at least one of the vertical displacement controls 115, 149.

It is noted that, when the operational chamber pressure is low, the pressure difference between the top and bottom surfaces of a substrate may not be high enough to apply sufficient vacuum force on the substrate during operation. The embodiments in FIGS. 1A-6 utilize a vacuum chuck in conjunction with a small gap Ds to generate an increased pressure difference.

To clean etch byproduct polymers, process gases may include an oxygen-containing gas, such as $O_2$. Small amounts, such as <10%, of a fluorine-containing gas, such as $CF_4$, $SF_6$, or $C_2F_6$, may also be added to clean the polymer. It will be appreciated that nitrogen-containing gas, such as $N_2$, may also be included in the gas mixture. The nitrogen-containing gas may assist dissociation of the oxygen-containing gas. An inert gas, such as Ar or He, may also be added to dilute the gas and/or to maintain the plasma. To clean a dielectric film(s), such as SiN or $SiO_2$, at the bevel edge 140, a fluorine-containing gas, such as $CF_4$, $SF_6$, or a combination of both gases, may be used. An inert gas, such as Ar or He, may also be used to dilute the fluorine-containing gas and/or to maintain the cleaning plasma. To clean a metal film(s), such as Al or Cu, at the bevel edge 140, a chlorine-containing gas, such as $Cl_2$, or $BCl_3$, or a combination of both gases, may be used. An inert gas, such as Ar or He, can also be used to dilute the chlorine-containing gas and/or to maintain the plasma to clean the metal film(s).

As a variation of the embodiment in FIG. 1A, an RF power source is coupled to the top edge electrode 120, while the bottom edge electrode 126 is grounded to generate the capacitively coupled cleaning plasma. As another variation, either the top edge electrode 120 or the bottom edge electrode 126 is replaced with an inductive coil buried in a dielectric material. In this case, the inductive coil is coupled to an RF power source and the opposing electrode is grounded. The RF power source supplies power to generate an inductively coupled plasma for cleaning the bevel edge 140.

Figure 1C:
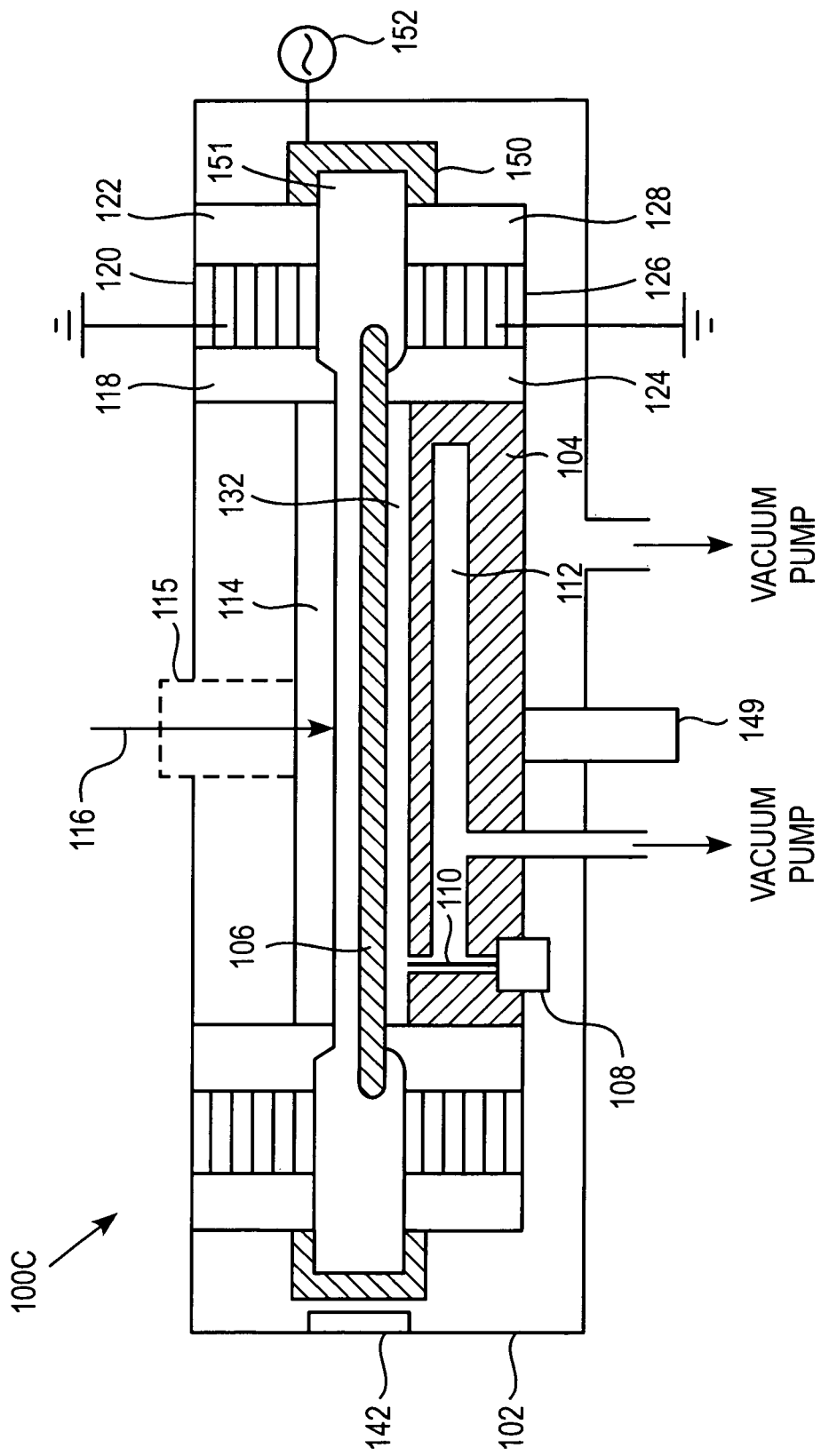
FIG. 1C shows a schematic cross sectional diagram of a substrate etching system having a vacuum chuck and a hollow cathode ring in accordance with another embodiment.

FIG. 1C shows a schematic cross sectional diagram of a bevel etcher 100C in accordance with another embodiment. The components in the etcher 100C are similar to those shown in FIG. 1A. The difference is that, in this embodiment, a hollow cathode ring 150, which is made of a conductive material, such as aluminum, is located outside the insulating rings 122, 128. The hollow cathode ring 150 has a channel 151 that faces the bevel edge. The width of the channel 151 is greater than about 1.5 cm, for instance. It is noted that the hollow cathode ring 150 is moved in a vertical direction during loading/unloading the substrate 106 by a suitable displacement device (not shown in FIG. 1C).

In one embodiment, the hollow cathode ring 150 is coupled to an RF power source 152 and both top and bottom edge electrodes 120, 126 are grounded. The RF power source preferably supplies RF power in a frequency range from, but not limited to, ~2 MHz to ~13 MHz, for instance. In another embodiment, the top edge electrode 120 is coupled to an RF power source while the bottom edge electrode 126 and the hollow cathode ring 150 are grounded. In a further embodiment, the bottom edge electrode 126 is coupled to an RF power source while the top edge electrode 120 and the hollow cathode ring 150 are grounded.

If desired, capacitively coupled plasma can be used to clean the interior of the wall 102. To generate plasma for cleaning the interior, a high-frequency RF power, which has a frequency range from ~27 MHz to ~60 MHz, for instance, is preferred. In a variation of the embodiment in FIG. 1C, the top edge electrode 120 is coupled to a low-frequency (~2 MHz to ~13 MHz) RF power source while the bottom edge electrode 126 is coupled to a high-frequency RF power source (~27 MHz to ~60 MHz) and the hollow cathode ring 150 is grounded. In another variation, the top edge electrode 120 is coupled to a high-frequency RF power while the bottom edge electrode 126 is coupled to a low-frequency RF power source and the hollow cathode ring 150 is grounded. In yet another variation, the top edge electrode 120 and the hollow cathode ring 150 are grounded, while the bottom edge electrode 126 is coupled to both low- and high-frequency RF power sources.

Figure 1D:
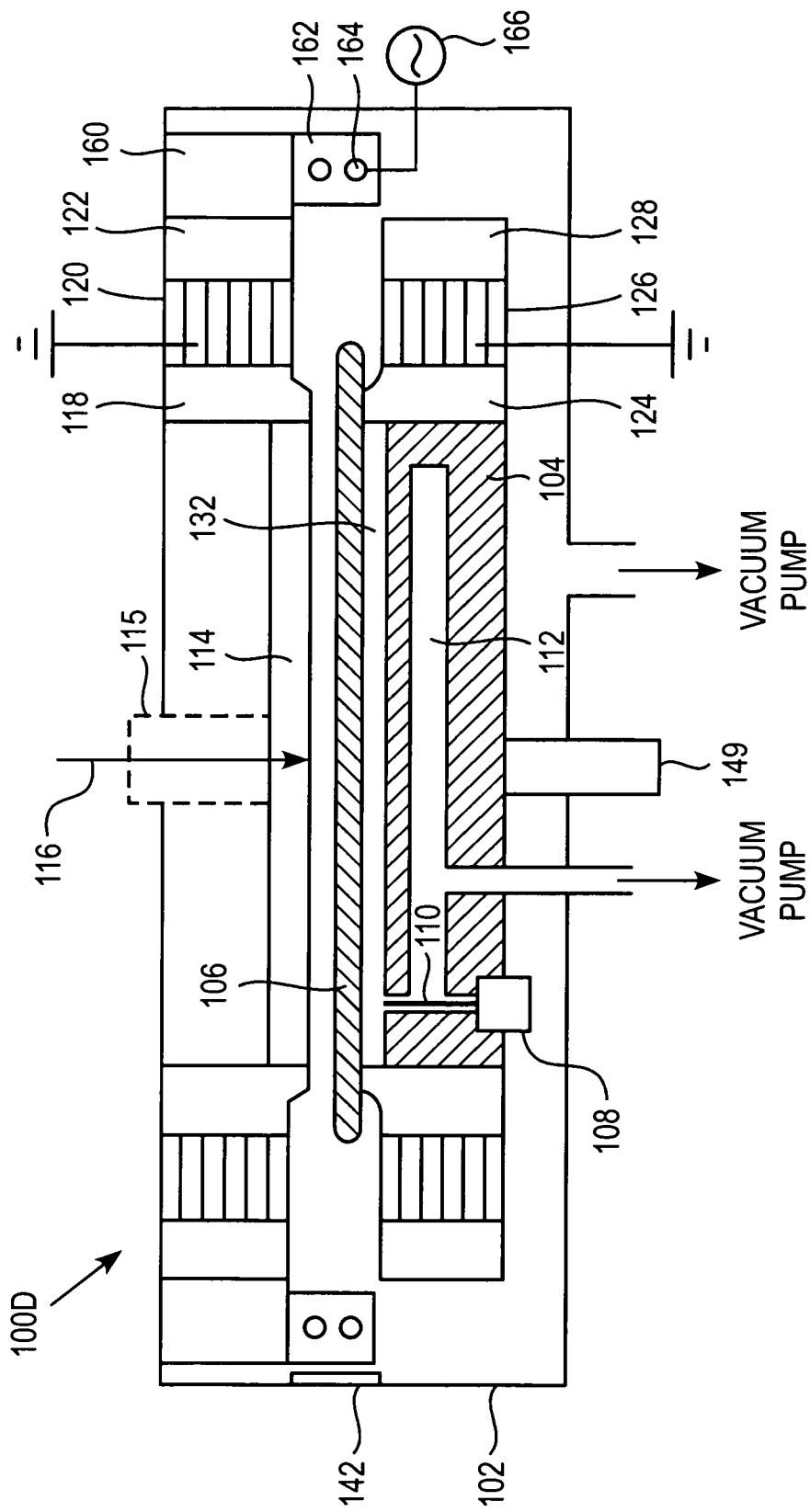
FIG. 1D shows a schematic cross sectional diagram of a substrate etching system having a vacuum chuck and inductive coils in accordance with another embodiment.

FIG. 1D shows a schematic cross sectional diagram of a bevel etcher 100D in accordance with another embodiment. The components of the bevel etcher 100D are similar to those shown in FIG. 1A. The difference is that an inductive coil(s) 164 surrounds the substrate edge and the space between the top edge electrode 120 and the bottom edge electrode 126. The inductive coil 164 is embedded in a dielectric material 162 that is coupled to a dielectric support 160. The dielectric support 160 includes a displacement mechanism for moving the inductive coil 164 in the vertical direction during loading/unloading the substrate 106.

The inductive coil 164 is coupled to an RF power source 166. During the bevel edge cleaning process, the RF power source 166 preferably supplies RF power in a range, but not limited to, from ~2 MHz to ~13 MHz to generate an inductive plasma near the substrate edge. The top edge electrode 120 and the bottom edge electrode 126 are grounded to provide a return path for the inductively coupled plasma. The inductive coil 164 provides cleaning plasma to clean the bevel edge 140. In a variation, the inductive coil 164 can also be coupled to a high-frequency RF power source to generate chamber interior cleaning plasma. It is noted that the top surface of the vacuum chucks shown in FIGS. 1A, 1C, 1D are covered with a dielectric layer.

Figure 2:
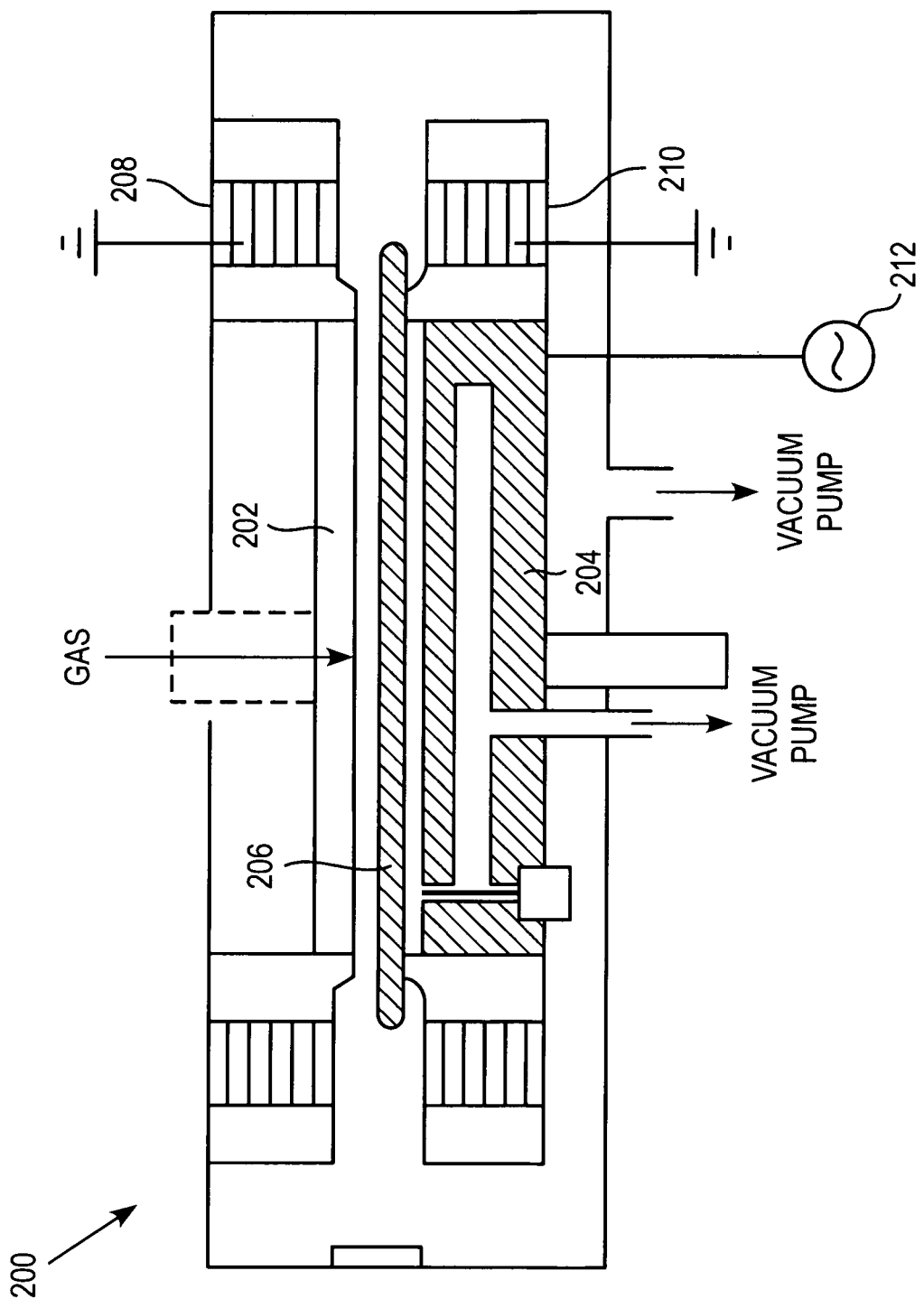
FIG. 2 shows a schematic cross sectional diagram of a substrate etching system having a vacuum chuck coupled to an RF power source in accordance with another embodiment.

FIG. 2 shows a schematic cross sectional diagram of a bevel etcher 200 in accordance with another embodiment. The etcher 200 is similar to that shown in FIG. 1A but differs in that the vacuum chuck 204 is coupled to an RF power source 212 and both the top and bottom edge electrodes 208, 210 are grounded. In this embodiment, the bottom surface of the gas distribution plate 202 is covered with a dielectric layer to obviate formation of an electric field or an electromagnetic field between the substrate 206 and the gas distribution plate 202.

Figure 3:
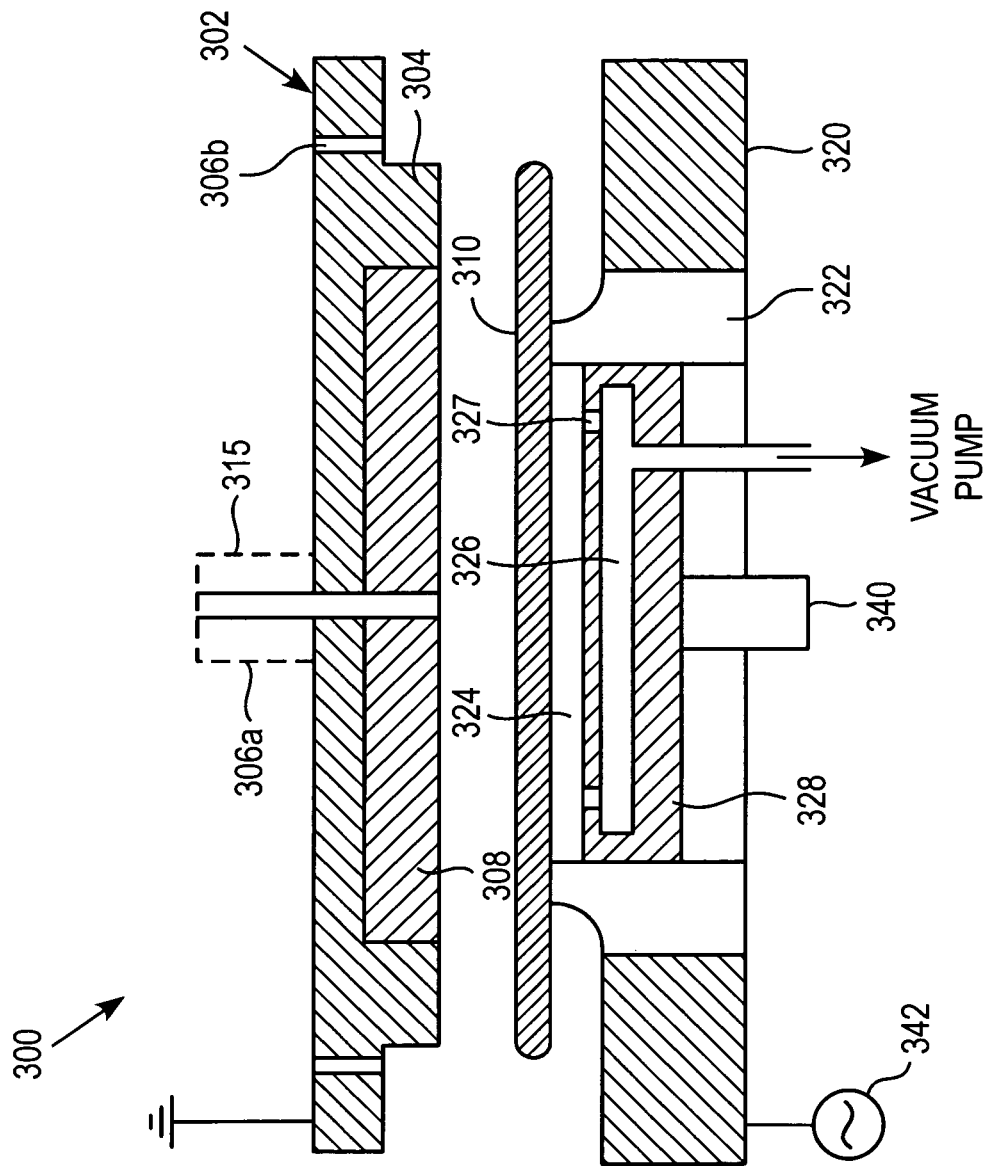
FIG. 3 shows a schematic cross sectional diagram of a substrate etching system having a vacuum chuck and two electrodes in accordance with another embodiment.

FIG. 3 shows a schematic cross sectional diagram of a bevel etcher 300 in accordance with another embodiment, wherein the chamber wall is not shown for brevity. The bevel etcher 300 includes: a vacuum chuck 328 having a vacuum region 324 beneath a substrate 310 and operative to hold a substrate 310 in place during operation; a top electrode 302 positioned over the substrate 310; a bottom support ring 322 surrounding the vacuum chuck 328; and a bottom electrode 320 surrounding the support ring 322. The top electrode 302 and bottom electrode 320 generate plasma for removing foreign materials deposited and accumulated on the bevel edge of the substrate 310.

The top electrode 302 is a flat circular plate with an outer ring-shaped protrusion 304 extending vertically toward the bottom electrode. The protrusion has an outer periphery vertically aligned with the outer periphery of the substrate 310. The inner periphery of the protrusion 304 is vertically aligned with the inner periphery of bottom electrode 320. One or more gas passages 306 are used to provide a process gas(es) and/or purge gas(es). A gas hole 306a is located at the center of the top electrode 302 while the gas holes 306b are located between the protrusion 304 and the peripheral edge of the top electrode 302. The top electrode 302 is an anode and the bottom electrode 320 is a cathode. As a variation, the top electrode 302 can be used as a cathode and the bottom electrode 320 is used as an anode.

An insulator layer or an insulator plate 308 is deposited on or attached to the bottom surface of the top electrode 302 and located inside of the protrusion 304. The insulator 308 has an exposed surface facing the substrate 310 and the exposed surface can be coplanar with an exposed surface of the protrusion 304. However, the insulator's exposed surface can be offset vertically above or below the exposed surface of the protrusion if desired. The insulator 308 inhibits formation of an electric field or an electromagnetic field between the top electrode 302 and the substrate 310 when RF power is supplied between the top and bottom electrodes 302, 320.

For processing semiconductor wafers, the bottom electrode 320 is a circular ring having an inner diameter that is the same as the inner diameter of the protrusion 304. The bottom electrode 320 is preferably coupled to an RF power source 342. During operation, plasma is generated in the region between the protrusion 304 and the bottom electrode 320.

The vacuum chuck 328 includes a plenum 326 that is in fluid communication with the vacuum region recess ("vacuum region") 324 via one or more passages 327 and evacuated by a vacuum pump during operation. The plenum 326 reduces temporal pressure fluctuations in the vacuum region 324 and, for a chuck design where passages 327 are arranged in a wide pattern provides a uniform suction rate for the holes 327. The vacuum chuck 328 is preferably supported by a movable support 340 that moves the vacuum chuck upwardly and downwardly in the vertical direction to adjust the volume of the vacuum region. In a variation, the top electrode 302 is suspended from and moved vertically by an optional support 315. Optionally, the top surface of the vacuum chuck 328 may be covered with a dielectric layer to obviate formation of an electric or electromagnetic field in the vacuum region 324.

As a variation of the embodiment in FIG. 3, the vacuum chuck 328 may include lift pins that are similar to those shown in FIGS. 1A-2, wherein the holes 327 are used as paths for the lift pins. Likewise, the embodiments in FIGS. 1A-2 may have holes similar to holes 327 in FIG. 3, wherein the holes are not used as paths for the lift pins. As another variation, the vacuum chuck does not include a plenum and the holes 327 are coupled to a vacuum pump directly.

Figure 4A:
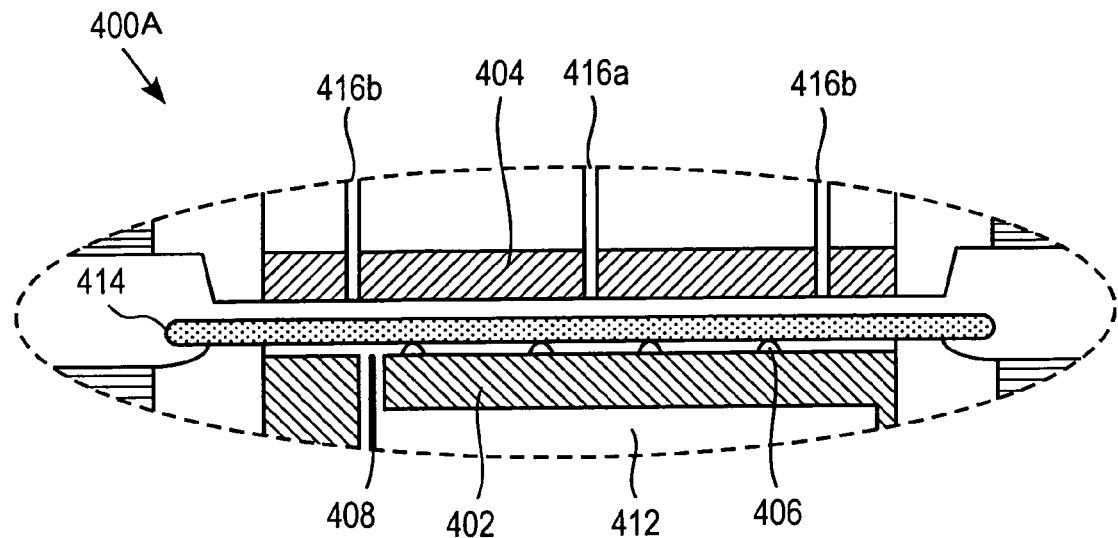
FIG. 4A shows a portion of a schematic cross sectional diagram of a substrate etching system having a vacuum chuck in accordance with another embodiment.
Figure 4B:
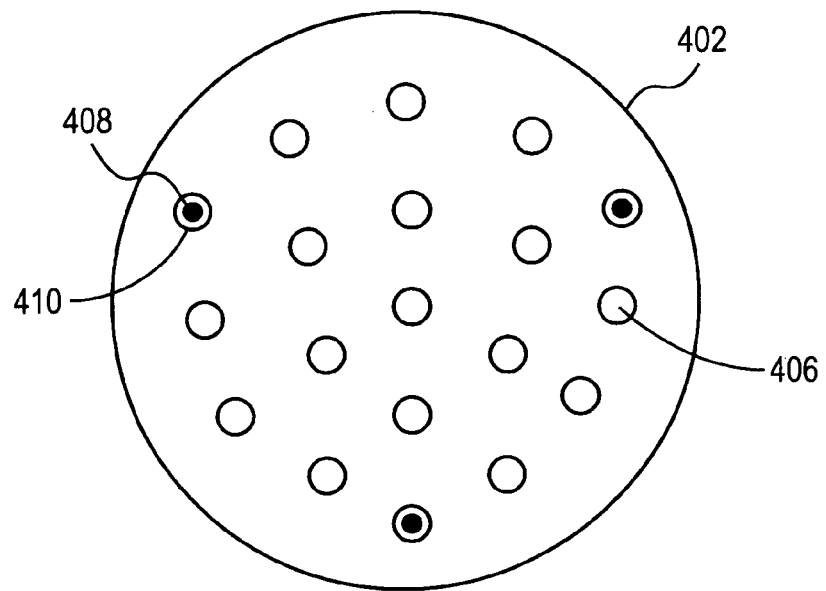
FIG. 4B shows a top plan view of the vacuum chuck in FIG. 4A.

FIG. 4A shows a portion of a schematic cross sectional diagram of a bevel etcher 400A for cleaning the bevel edge of a substrate 414 in accordance with another embodiment. The components of the bevel etcher 400A are similar to those in FIG. 1A, with the difference that the vacuum chuck 402 includes a plurality of bumps or protruding elements 406. The protruding elements 406 may have a hemispherical shape or any other suitable geometry, and prevent the substrate 414 from bowing due to the pressure difference between the top and bottom surfaces of the substrate 414. For example, the protruding elements 406 can be in the form of a mesa array or series of rings integrally formed with chuck 402 or bonded to the upper surface of the chuck. FIG. 4B shows a top plan view of the vacuum chuck 402 in FIG. 4A. As depicted, the lift pins 408 can move vertically in holes 410 and a portion of each hole is shared as a gas passageway and coupled to a plenum 412.

It is noted that the protruding elements 406 can be formed in the embodiments of FIGS. 1C-3 for the same purpose. It is also noted that the gas distribution plate 404 can include center gas passage 416a and circumferentially spaced apart outer gas passages 416b.

Figure 5:
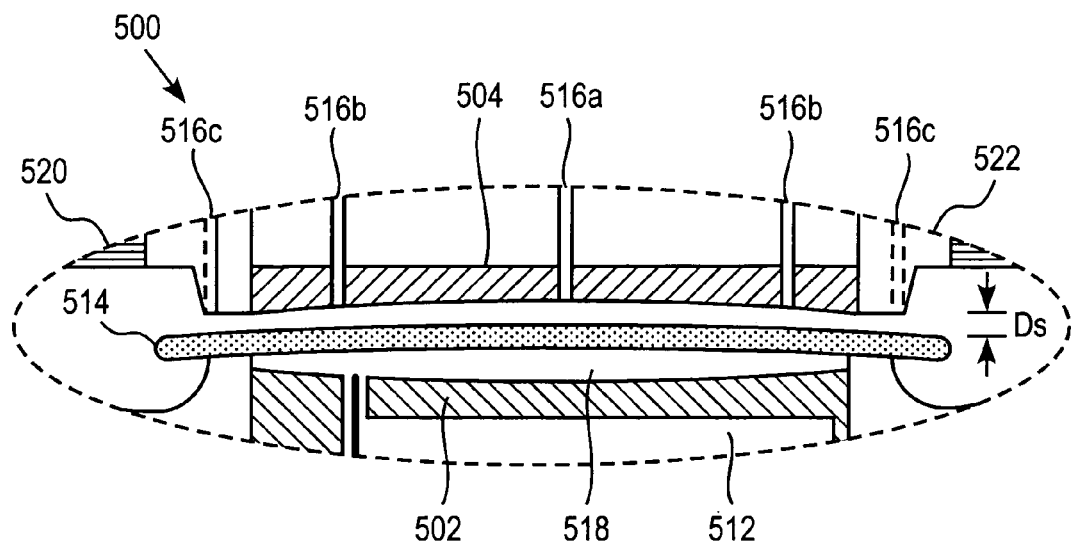
FIG. 5 shows a portion of a schematic cross sectional diagram of a substrate etching system having curved surfaces to accommodate a bowed substrate in accordance with another embodiment.

As discussed above, a substrate to be loaded into a bevel etcher may have integrated circuits formed on the top surface thereof by a series of processes. One or more of the processes may be performed by use of plasma that may transfer heat energy to the substrate, such that thermal stress on the substrate causes wafer bowing. FIG. 5 shows a portion of a schematic cross sectional diagram of a bevel etcher 500 having a vacuum chuck 502 in accordance with another embodiment. The components of this embodiment are similar to those shown in FIG. 1A, with the difference that at least one of the two opposing surfaces, which are the top surface of the vacuum chuck 502 and the bottom surface of the gas distribution plate 504, has a curvature to accommodate a bowed substrate 514. In this embodiment, the opposing surfaces are further apart in the center and closer together at the outer periphery thereof. If all of the substrates to be loaded in the bevel etcher 500 are bowed in one direction, only one of the two opposing surfaces may have a curvature shaped to accommodate the substrates.

The substrate bowing can be reduced by use of the pressure difference between the top and bottom surfaces of the substrate 514. The pressure in the vacuum region 518 is maintained under vacuum during operation by a vacuum pump coupled to the plenum 512. By adjusting the gap Ds between the gas distribution plate 504 and the top surface of the substrate 514, the gas pressure in the gap Ds can be varied without changing the overall flow rate of the process gas(es). Thus, by controlling the size of the gap and the gas pressure in the gap, the pressure difference between the top and bottom surfaces of the substrate 514 can be varied and thereby the bending force applied on the substrate 514 can be controlled.

In a variation, the gas distribution plate 504 may have a plurality of holes, where the hole diameters can be varied to obtain an intended pressure distribution over the substrate 514. For instance, the holes can have larger diameters in the area near the bevel edge and smaller in the area over the center of the substrate. It should be apparent to those of ordinary skill that the bevel etcher 500 may have any suitable number of gas feeds. It should be also apparent that the vacuum chuck 502 and the gas feeding system, which includes the gas distribution plate 504 and gas feed holes 516a-516c, can be incorporated in the embodiments in FIGS. 1B-4.

As another variation, additional gas feeds 516c may be formed in the top dielectric ring 522 or top edge electrode 520. The gas feeds 516a-516b are used to introduce gases having different pressures into various portions of the gap Ds, resulting in an intended pressure distribution along the radial direction (center to edge) of the gap. For instance, if the substrate 514 is convex with respect to the gas distribution plate 504, the gas feed 516a can direct gas under higher pressure on the top surface of the substrate 514 than the gas feed 516b. In another instance, if the substrate 514 is convex with respect to the vacuum chuck 502, only the gas feeds 516c are used during a bevel edge cleaning operation.

Figure 6:
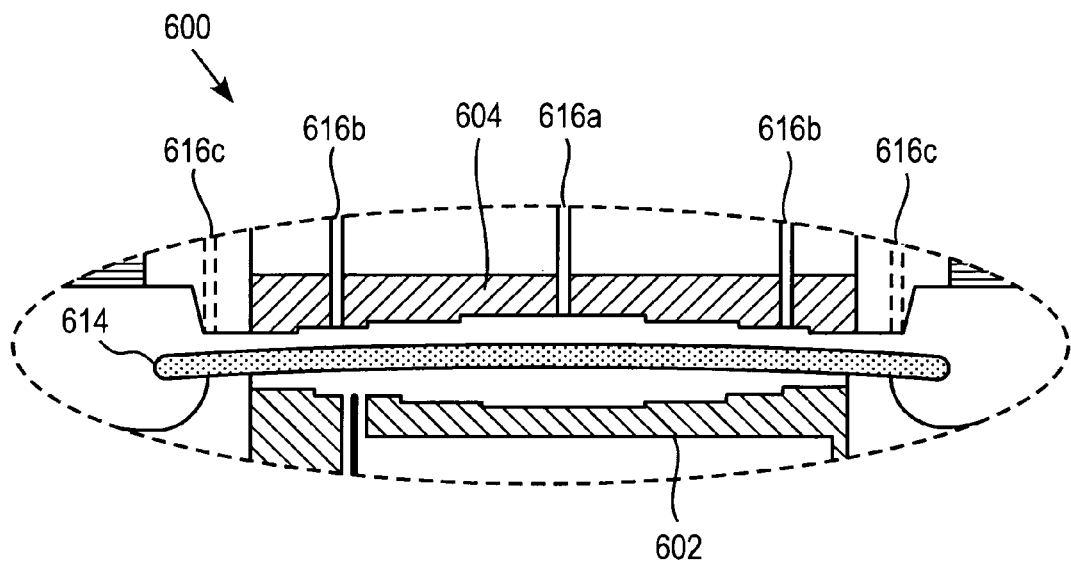
FIG. 6 shows a portion of a schematic cross sectional diagram of a substrate etching system having stepped surfaces to accommodate a bowed substrate in accordance with yet another embodiment.

FIG. 6 shows a portion of a schematic cross sectional diagram of a bevel etcher 600 in accordance with yet another embodiment. As depicted, the components of the bevel etcher 600 are similar to those shown in FIG. 5. The difference is that at least one of the two opposing surfaces, which are the top surface of the vacuum chuck 602 and the bottom surface of the gas distribution plate 604, is stepped to accommodate a bowed substrate 614. For instance, the plate and/or chuck 604 can have a single step formed by a cylindrical recess extending 25% or more across the surface. In another example, a series of progressively deeper and coaxial recesses can extend into the surface. In the embodiment shown, the recesses form three steps in each opposing surface. If all of the substrates to be loaded in the bevel etcher 600 are bowed in one direction, only one of the two opposing surfaces may have one or more steps to accommodate the substrates. It is noted that the vacuum chuck 602 and the gas feeding system, which includes the gas distribution plate 604 and gas feeds 616a-616c, can also be applied to the embodiments in FIGS. 1B-4.

Figure 7:
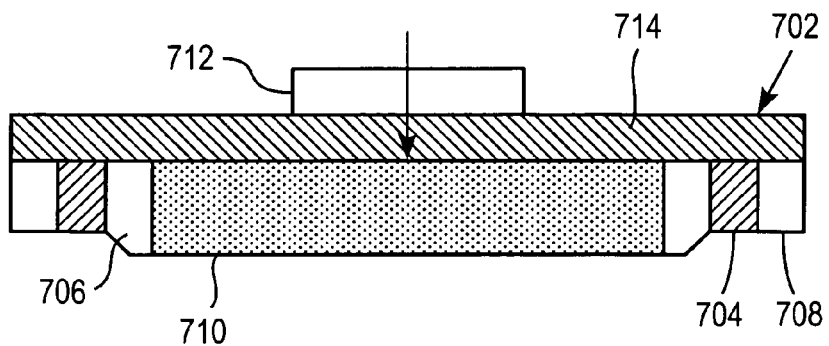
FIG. 7 shows a schematic cross sectional diagram of an upper electrode assembly in accordance with another embodiment.

FIG. 7 shows a schematic cross sectional diagram of an upper electrode assembly 702 in accordance with another embodiment. The upper electrode assembly 702 is similar to that shown in FIG. 1A. The difference is that the upper electrode assembly 702 includes a metal support component 714 and that the top edge electrode 704, top dielectric ring 706, top insulating ring 708, and gas distribution plate 710 are secured to the metal support component 714. The upper electrode assembly 702 is suspended from and moved by a support 712. The upper electrode assembly 702 can be applied to the embodiments shown in FIGS. 1A, 1C, 1D, 2, 4A, 5, and 6.

In the embodiments in FIGS. 1A-2 and 3-6, the gas distribution plate is electrically insulated from the top edge electrode by the top dielectric ring. As a variation, the gas distribution plate and the top dielectric ring are integrally formed in one body and made of a single piece of dielectric material.

While the invention has been described in detail with reference to specific embodiments thereof, it will be apparent to those skilled in the art that various changes and modifications can be made, and equivalents employed, without departing from the scope of the appended claims.

What is claimed is:

1. A bevel etcher wherein a bevel edge of a semiconductor substrate can be plasma etched, comprising:
   a chamber having an interior in which the bevel edge of the semiconductor substrate can be plasma etched;
   a support surface configured to support the semiconductor substrate such that the bevel edge of the substrate extends outwardly of an outer edge of the support surface;
   a recessed surface with lift pin holes therein, the recessed surface being below the underside of the substrate supported on the support surface, the recessed surface defining a vacuum region beneath the substrate supported on the support surface;

a plasma generation unit adapted to energize process gas into a plasma state in the vicinity of the bevel edge, the plasma generation unit comprising a first electrode ring surrounding the support surface;

a gas feeding system including a gas distribution plate having a bottom surface opposing a chuck body and including at least one hole through which process gas flows and applies gas pressure to a top surface of the substrate;

a second electrode ring surrounding the gas distribution plate and opposing the first electrode ring;

a source of vacuum in fluid communication with the interior of the chamber to provide an operational chamber pressure; and a source of vacuum in fluid communication with the vacuum region via the lift pin holes;

wherein the chuck body is of electrically conductive metal coupled to a radio frequency (RF) power source to generate the plasma; and the top surface of the substrate and the vacuum region have a pressure difference above a threshold.

2. The bevel etcher as recited in claim 1, wherein: (a) one of the first and second electrode rings is grounded and the other is coupled to a radio frequency (RF) power source and wherein the first and second electrode rings are operative to energize the process gas into the plasma upon receiving RF power from the RF power source; (b) a hollow cathode ring disposed along the first and second electrode rings wherein one of the hollow cathode ring and the first and second electrode rings is coupled to a radio frequency (RF) power source and the others are grounded and wherein the hollow cathode ring and the first and second electrodes are operative to energize the process gas into the plasma upon receiving RF power from the RF power source or (c) a coil inductively coupled to a radio frequency (RF) power source, disposed along the first and second electrode rings, and operative to energize the process gas into the plasma, wherein the first and second electrode rings are grounded.

3. The bevel etcher as recited in claim 1, wherein: (a) the bottom surface of the gas distribution plate is concave to accommodate a bowed shape of the substrate; (b) the bottom surface of the gas distribution plate includes multiple steps to accommodate the substrate; (c) the recessed surface of the chuck body is concave to accommodate a bowed shape of the substrate; (d) the recessed surface of the chuck body includes multiple steps to accommodate a bowed shape of the substrate; (e) protruding elements are disposed on the recessed surface of the chuck body and include tips supporting the bottom surface of the substrate upon contact therewith; or (f) protruding elements in the form of a mesa array or spaced apart rings are disposed on the recessed surface of the chuck body and include tips supporting the bottom surface of the substrate upon contact therewith.

4. A bevel etcher as recited in claim 1, wherein: (a) the first and second electrode rings are grounded or (b) an upper dielectric ring is positioned between the gas distribution plate and the second electrode ring and adapted to electrically insulate the gas distribution plate from the second electrode ring.

5. A bevel etcher as recited in claim 1, further comprising a gap control mechanism adapted to adjust the height of a gap between the bottom surface of the gas distribution plate and the recessed surface of the chuck body thereby controlling a vertical separation between the bottom surface of the gas distribution plate and top surface of the substrate.

6. A bevel etcher as recited in claim 5, wherein the vertical separation is less than about 0.6 mm.

7. A bevel etcher as recited in claim 1, wherein the recessed surface is in a chuck body which includes a plurality of cylindrical holes extending to the vacuum region;

a plurality of lift pins adapted to move the substrate in a direction normal to the recessed surface of the chuck body, each lift pin being adapted to move along one of the cylindrical holes; and a pin operating unit which mechanically moves the lift pins.

8. A bevel etcher as recited in claim 7, wherein: (a) a portion of each of the holes forms a gas passageway through which the vacuum source evacuates the vacuum region or (b) the chuck body includes a plenum in fluid communication with the vacuum region via the holes.

9. The bevel etcher as recited in claim 1, wherein the recessed surface is in a chuck body, the support surface is an upper surface of a support ring, and the plasma generation unit includes:

a first electrode surrounding the support ring and electrically insulated from the chuck body by a support ring;

a second electrode including a flat plate, a ring-shaped protrusion opposing the first electrode, and at least one gas passage through which process gas is injected into the chamber; and an insulating layer disposed beneath the flat plate and inside the ring-shaped protrusion;

wherein the bottom surface of the insulating layer is in a spaced apart relationship with the recessed surface of the chuck body to form a space for receiving the substrate therein and wherein one of the first and second electrodes is grounded and the other is coupled to a radio frequency (RF) power source and wherein the first and second electrodes are operative to energize the process gas into the plasma upon receiving RF power from the RF power source.

10. The bevel etcher as recited in claim 9, wherein: (a) the bottom surface of the insulating layer is concave to accommodate bowing of the substrate; (b) the bottom surface of the insulating layer includes multiple steps to accommodate bowing of the substrate; (c) the top surface of the chuck body is concave to accommodate bowing of the substrate; (d) the top surface of the chuck body includes multiple steps to accommodate bowing of the substrate; (e) protruding elements are disposed on the top surface of the chuck body and include tips supporting the bottom surface of the substrate upon contact therewith; or (f) protruding elements in the form of a mesa array or spaced apart rings are disposed on the recessed surface of the chuck body and include tips supporting the bottom surface of the substrate upon contact therewith.

11. The bevel etcher of claim 1, wherein the source of vacuum in fluid communication with the interior of the chamber and the source of vacuum in fluid communication with the vacuum region are separate sources of vacuum.

* * * * *